(12) United States Patent
Kermarec et al.

(10) Patent No.: US 7,749,817 B2
(45) Date of Patent: Jul. 6, 2010

(54) SINGLE-CRYSTAL LAYER ON A DIELECTRIC LAYER

(75) Inventors: Olivier Kermarec, Gieres (FR); Yves Campidelli, Grenoble (FR)

(73) Assignee: STMicroelectronics (Crolles) SAS, Crolles (FR)

( * ) Notice: Subject to any disclaimer, the term of this patent is extended or adjusted under 35 U.S.C. 154(b) by 568 days.

(21) Appl. No.: 11/653,796

(22) Filed: Jan. 16, 2007

(65) Prior Publication Data

US 2007/0228384 A1  Oct. 4, 2007

(30) Foreign Application Priority Data

Jan. 17, 2006  (FR)  .................. 06 00413

(51) Int. Cl.
*H01L 21/00* (2006.01)
*H01L 21/84* (2006.01)
*H01L 21/76* (2006.01)
*H01L 21/20* (2006.01)
*H01L 21/36* (2006.01)

(52) U.S. Cl. .................. 438/149; 438/412; 438/479; 438/480

(58) Field of Classification Search .................. 438/149, 438/412–413, 479–481, E27.112, E29.147
See application file for complete search history.

(56) References Cited

U.S. PATENT DOCUMENTS

| 4,952,526 A | * | 8/1990 | Pribat et al. | .................. 438/481 |
|---|---|---|---|---|
| 6,537,370 B1 | | 3/2003 | Hernandez et al. | |
| 2004/0157412 A1 | | 8/2004 | Seifert | |
| 2005/0054180 A1 | | 3/2005 | Han et al. | |
| 2005/0136566 A1 | | 6/2005 | Morse | |
| 2006/0281232 A1 | * | 12/2006 | Hsu et al. | .................. 438/149 |

OTHER PUBLICATIONS

Min-Lin Cheng et al., "Selective Ge CVD as a Via Hole Filling Method and Self-Aligned Impurity Diffusion Microsource in Si Processing," Japanese Journal of Applied Physics, Tokyo, Japan, vol. 28, No. 11, Part 2, Nov. 1, 1989, pp. L2054-L2056.

* cited by examiner

*Primary Examiner*—Cuong Q Nguyen

(57) ABSTRACT

A system and method for producing a single-crystal germanium layer on a dielectric layer by producing a germanium-on-insulator assembly between the surface portions of the third material. The choice of location for these surface portions therefore makes it possible to define the zone on which it is desired to produce the germanium-on-insulator layer. The wafer may be freely chosen between a pure single-crystal silicon wafer and a silicon-on-insulator wafer. A single-crystal germanium first layer is produced on the surface portion of the silicon. The RPCVD produces a partially crystalline germanium first layer. The layer thus comprises various nuclei that have crystallized in possibly different lattices. After carrying out a recrystallization annealing operation, which makes the layer monocrystalline by recrystallizing the various nuclei in one and the same crystal lattice. Thus, the layers are continuous with the single-crystal silicon lattice.

20 Claims, 2 Drawing Sheets

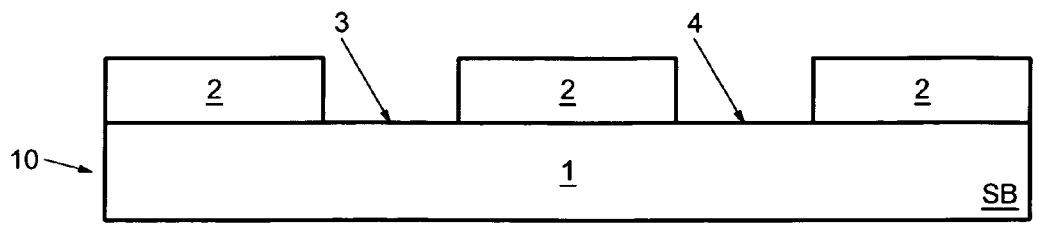
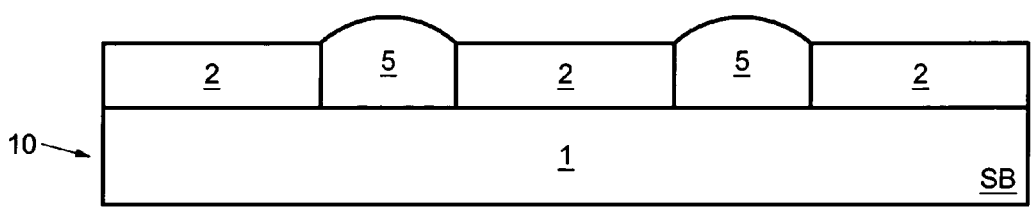
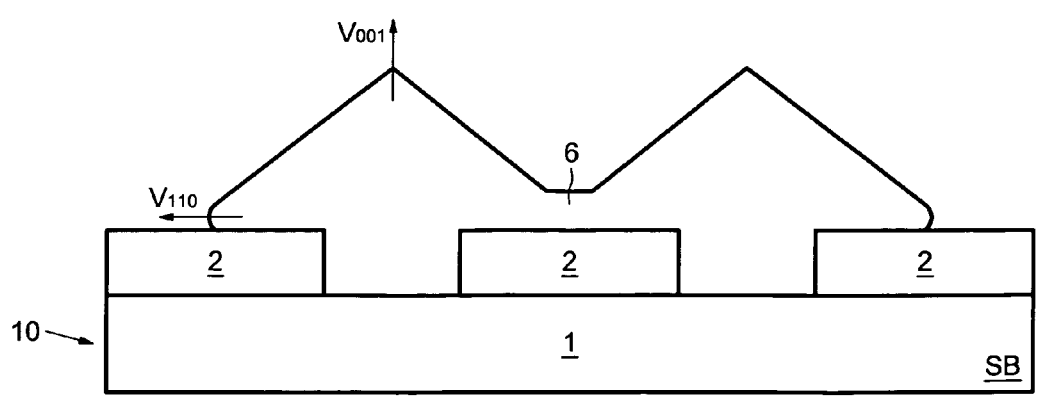

SINGLE-CRYSTAL LAYER ON A DIELECTRIC LAYER

CROSS-REFERENCE TO RELATED APPLICATIONS

The present application is related to French Patent Application No. 0600413, filed Jan. 17, 2006, entitled "PROCESS FOR THE PRODUCTION OF A SINGLE-CRYSTAL LAYER ON A DIELECTRIC LAYER". French Patent Application No. 0600413 is assigned to the assignee of the present application and is hereby incorporated by reference into the present disclosure as if fully set forth herein. The present application hereby claims priority under 35 U.S.C. §119(a) to French Patent Application No. 0600413.

TECHNICAL FIELD

The present disclosure relates to a system and method of producing a single-crystal semiconductor layer on a dielectric layer, and more particularly to the localized production of a single-crystal semiconductor layer on a dielectric layer.

BACKGROUND

Semiconductor wafers are the substrates for current integrated circuits. The conventional production and performance of integrated circuits fabricated on a wafer are dependent on the choice, quality and dimensions of the semiconductor material of the wafer. Originally made of pure silicon, wafer compositions have evolved owing to the advent of new technologies. Thus, one example of how semiconductor wafers have evolved is the production of single-crystal SOI (Silicon On Insulator) wafers. In these wafers, the silicon layer useful for integration of devices is much thinner than hitherto, being of the order of a few tens of nanometers. A subjacent dielectric layer, interposed between the useful silicon layer and the silicon substrate, makes it possible not only to give the assembly rigidity but also to act as an electrical insulator. Thus, the performance of transistors produced in this type of wafer can be enhanced.

In some conventional semiconductor wafers, silicon is replaced with a semiconductor material having a lower electrical resistivity. An example of such a material is germanium. Thus, a silicon-germanium alloy on insulator wafers and a strained silicon-germanium alloy on insulator wafers have been proposed. The latter have an even lower resistivity due to the stresses exerted on the semiconductor layer. Germanium on insulator wafers has been made possible with processes similar to those already used to produce silicon on insulator wafers and described in, for example, the document "Réalisation en première mondiale du substrats Germanium sur Isolant (GeOI) [*First production in the world of germanium-on-insulator (GeOI) substrates*"] accessible on the Commissariat à l'Energie Atomique Internet site: www.cea.fr. This process essentially produces a weakened zone within the depth of a bulk material by using implanted ions to cause a fracture along the weakened plane and create a thin wafer. This process, however, produces only entire germanium-on-insulator wafers.

Germanium is a costly material and is less abundant than silicon. Moreover, the most effective technology uses silicon or germanium depending on the type of device (n-channel or p-channel transistor) or the type of function (electronic or optoelectronic). Thus, to combine the advantages of the two technologies, it may be advantageous to integrate the silicon and germanium technologies on the same integrated circuit. This is generally referred to as "co-integration". Co-integration may thus require germanium-on-insulator zones to be locally integrated on a silicon substrate. The process described above therefore cannot be adapted to cases in which silicon and germanium technologies must be used together in integrated circuits.

There is therefore a need for a process to produce a layer of single-crystal first material on a second material, where the second material is located between at least two surface portions of a single crystal third material.

SUMMARY

The present disclosure provides a system and process for producing, for a semiconductor wafer, a single-crystal layer on a dielectric layer.

In one embodiment, the present disclosure provides a method of producing a single-crystal layer of first material on a second material located between at least two surface portions of a single-crystal third material. The method includes forming a single-crystal layer of the first material on each of the two surface portions of the third material. The method also includes growing the single-crystal layer epitaxially until the second material is covered by the first material. The method further includes performing an annealing operation on the single-crystal layer.

In another embodiment, the present disclosure provides a method of producing single-crystal layer of first material on a second material located between at least two surface portions of a single-crystal third material. The method includes growing the single-crystal layer epitaxially until the second material is covered by the first material. The method also includes performing an annealing operation on the single-crystal layer and depositing a dielectric layer encapsulating the layer of the first material. The method further includes performing a second annealing operation at a temperature above the melting point of the first material and removing the encapsulating dielectric layer.

In still another embodiment, the present disclosure provides a semiconductor wafer. The semiconductor wafer includes a layer of first material comprising germanium on a second material located between at least on two surface portions of a single-crystal third material. The semiconductor wafer also includes a dielectric layer encapsulating at least a portion of the layer of first material.

Other technical features may be readily apparent to one skilled in the art from the following figures, descriptions and claims.

BRIEF DESCRIPTION OF THE DRAWINGS

For a more complete understanding of this disclosure and its features, reference is now made to the following description, taken in conjunction with the accompanying drawings, in which:

FIG. 1 is a sectional view of a wafer portion of a single-crystal material on which a dielectric layer is produced;

FIG. 2 illustrates a single-crystal layer of the first material on each of the surface portions of the material;

FIG. 3 illustrates a single-crystal layer of the first material grown epitaxially;

DETAILED DESCRIPTION

Figure 4:
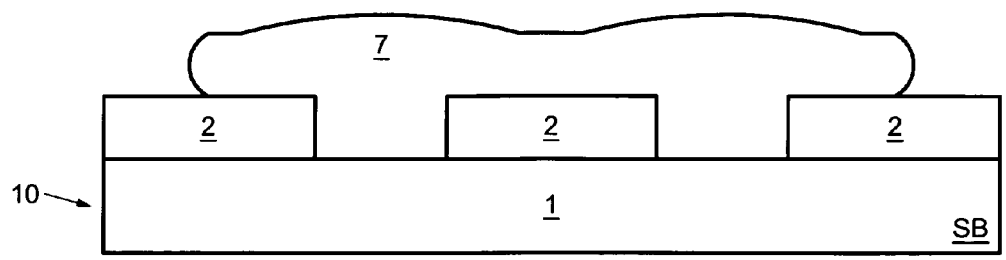
FIG. 4 illustrates the surface of the layer of first material before removing the remaining undulations on the surface of the layer of first material.

FIG. 1 is a sectional view of a wafer portion 10 of a single-crystal material 1 on which a dielectric layer 2 is produced. The dielectric layer 2 has two apertures, each exposing a portion 3, 4 of the single-crystal material 1. The wafer in FIG. 1 may be produced, for example, by depositing a uniform dielectric layer 2 on the material 1.

The apertures are produced by anisotropic etching. An irradiated resist defines the position of the apertures and then aids in etching the dielectric layer 2 until the surface 3, 4 of the single-crystal material 1 has been exposed. Once the apertures are obtained, the surface portions 3, 4 of the material 1 are prepared using pre-epitaxy cleaning processes. In the cases where a single-crystal silicon wafer is used, this cleaning may be carried out using a hydrofluoric acid (HF) bath followed by rinsing with deoxygenated deionized water and then drying with isopropyl alcohol.

FIG. 2 illustrates the step of producing a single-crystal layer 5 of the first material on each of the surface portions 3, 4 of the material 1. If the surface portions 3, 4 are separate, a single-crystal layer 5 on the portion 3 and a single-crystal layer 5 on the portion 4 are formed. However, if the surface portions 3, 4 completely surround one part of the insulating layer 2, there will therefore be only one single-crystal layer 5 surrounding the portion of insulating layer 2.

The single crystal layer 5 of first material is deposited by, for example, reduced-pressure chemical vapor deposition (RPCVD), at low temperature, in a "thermal" epitaxy reactor. RPCVD is generally known and disclosed in, for example, French Patent No. FR 2 783 254. The RPCVD deposition may be preceded by in situ cleaning of the surface, at a temperature between 700° C. and 1050° C., under a pressure of 10 to 80 torr and a flow rate of 10 to 30 slm (standard liters per minute, i.e. one liter per minute under standard pressure (1 atm) and temperature (0° C.) conditions) of $H_2$. The deposition of the first material, here germanium, takes place at a temperature between 300° C. and 450° C., under atmospheric pressure or reduced pressure (20 to 80 torr), with a $GeH_4/H_2$ flow rate of between 100 and 400 sccm (standard cubic centimeters per minute, i.e. one cubic centimeter per minute under standard pressure (1 atm) and temperature (0° C.) conditions) and with an $H_2$ flow rate of between 10 and 60 slm. The flow rates are given as an example, when $GeH_4/H_2$ corresponds to germane ($GeH_4$) diluted to 10% in hydrogen ($H_2$).

After the germanium has been deposited, a recrystallization annealing operation is carried out at a temperature between 800° C. and 900° C., for 1 minute, in a hydrogen atmosphere, according to, for example, the method described in French Patent FR 2 783 254. This annealing operation, which is then followed by the temperature being lowered down to 450° C., may be repeated three times. During the deposition, the germanium is naturally selective with respect to the insulator. The annealing that follows the deposition makes it possible to form the single-crystal layer 5 on the surface portions 3, 4.

FIG. 3 illustrates the step during which the previously formed single-crystal layer 5 of the first material is grown epitaxially. In the example of germanium, the temperature is firstly lowered, in a hydrogen atmosphere, to a temperature between 450° C. and 650° C. The germanium epitaxy is then carried out with 100 to 400 sccm of $GeH_4/H_2$ and with 10 to 60 slm of $H_2$. The flow rates are given by way of example when $GeH_4/H_2$ corresponds to germane ($GeH_4$) diluted to 10% in hydrogen ($H_2$). The epitaxy is carried out for the time needed to cover the part 2 of the second material located between the surface portions 3, 4 with germanium 6, as shown in FIG. 3. This joining between the two grown single-crystal layers 5 makes it possible for the second material 2 to be completely covered by the first material 6 over the distance separating the two portions 3 and 4. This is made possible by the lateral epitaxial growth of germanium. The epitaxial growth conditions are therefore adapted so as to have a maximum $V_{001}/V_{110}$ growth ratio. At the end of the step, a highly facetted layer 6 of the first material is obtained, in particular at the junctions between the two neighboring single-crystal layers 5.

A homogenization/planarization annealing operation is then carried out on the surfaces of the germanium layers 6. The annealing is carried out at a temperature between 750° C. and 900° C. in a hydrogen atmosphere, for a time that varies between one minute and a few hours depending on the size of and the desired final quality of the germanium. The annealing gives the germanium zones cohesion, in particular at the junctions, and makes it possible to planarize the surface. It may therefore be seen that it is important for the single-crystal layers 5 to join, as otherwise the coalescence of said layers 5 during the annealing cannot take place.

Figure 5:
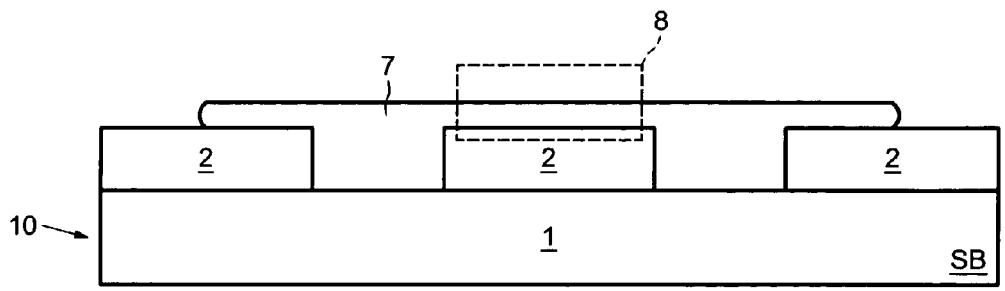
FIG. 5 illustrates a single-crystal germanium-on-insulator zone formed after removing the remaining undulations on the surface of the layer of first material.

FIG. 4 illustrates the surface of the layer 7 of the first material before performing the additional step of surface planarization by chemical-mechanical polishing. The polishing is carried out so as to remove the remaining undulations on the surface of the layer 7 of first material and to reduce the thickness of the layer 7, if required. What is then obtained is a single-crystal germanium-on-insulator zone 8 as shown in FIG. 5.

Figure 6:
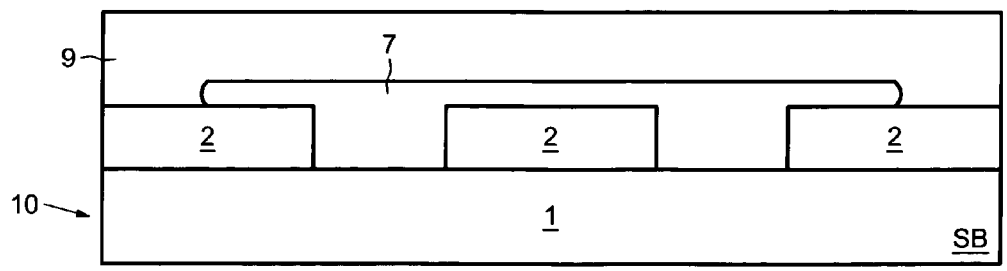
FIG. 6 illustrates an optional encapsulating dielectric layer covering a layer of first material.

FIG. 6 illustrates an optional additional step. In this step, the layer 7 of first material is covered with an encapsulating dielectric layer 9, for example silica or silicon nitride. The encapsulating layer 9 may also cover, for example, part of the free surface of the dielectric layer 2. An annealing operation is then carried out at a temperature above the melting point of the first material, and in a hydrogen atmosphere. In the case of germanium, the annealing may be carried out for example at a temperature above 800° C.

Thus, the present disclosure provides a method of producing a layer of a material such as germanium on a dielectric layer. In particular, the process makes it possible to produce a localized region in which there is a single-crystal germanium-on-insulator layer. According to one embodiment of the present disclosure, the surface of the layer of insulator is substantially parallel to the surface of the subjacent third material. In addition, the subjacent third material is preferably a layer of single-crystal silicon. The process comprises a lateral extension of the epitaxy on the oxidized zones.

Accordingly, one embodiment of the present disclosure relates to a process for producing a layer of single-crystal germanium on an insulator and on two portions of single-crystal silicon, the process comprising the step of forming a single-crystal germanium layer on the portions of single-crystal silicon, then the step of forming a single-crystal germanium layer on the insulator and on the single-crystal germanium layer formed on the single-crystal silicon portions.

The disclosed process makes it possible to produce, within one and the same wafer, transistors on a germanium-on-insulator substrate and transistors on a silicon-on-insulator substrate, or else transistors on a germanium-on-insulator substrate and transistors on a pure silicon substrate. The process also makes it possible to limit the amount of germanium deposited, and therefore to limit the costs. It is thus possible to produce areas ranging from a few square nanometres to a few square microns having a single-crystal germanium-on-insulator surface.

The first and third materials are preferably semiconductor materials comprising boron, germanium, silicon, arsenic, phosphorus, antimony, tellurium, polonium, astatine or mixtures thereof. The second material is a dielectric and preferably comprises an oxide of the third material or a nitride of the third material.

One embodiment of the present disclosure makes it possible to produce, in a localized manner, a single-crystal germanium layer on a dielectric layer by producing a germanium-on-insulator assembly between the surface portions of the third material. The choice of location for these surface portions therefore makes it possible to define the zone on which it is desired to produce the germanium-on-insulator layer.

As indicated, the third material preferably comprises silicon. In particular, the third material may be the single-crystal silicon layer of the wafer. The wafer may be freely chosen between a pure single-crystal silicon wafer and a silicon-on-insulator wafer. In the latter case, it is therefore possible to produce, for a lower cost, a wafer combining both the advantages of silicon on insulator and the advantages of germanium on insulator.

In one embodiment, the first material is germanium, the third is silicon and the second is silica. A single-crystal germanium first layer is produced on the surface portion of the silicon. The RPCVD produces a partially crystalline germanium first layer. The layer thus comprises various nuclei that have crystallized in possibly different lattices. After carrying out a recrystallization annealing operation, which makes the layer monocrystalline by recrystallizing the various nuclei in one and the same crystal lattice. Thus, the layers are continuous with the single-crystal silicon lattice.

The present disclosure also makes it possible, in certain cases, to integrate, into the integrated circuits produced on a single-crystal silicon layer, the technology developed around germanium, while avoiding a substantial cost increase. In addition, the proposed technique is much simpler than most other techniques which rely on complex sequences of lithography, etching and polishing operations, with one or two steps in epitaxy machines. The disclosed process may be linked together in a single epitaxy reactor with the exception of the planarizing and thinning of the first material which requires a tool other than the epitaxy reactor.

In particular, the present disclosure makes it possible to produce, within one and the same wafer, either transistors on a germanium-on-insulator substrate with transistors on a silicon-on-insulator substrate, or transistors on a germanium-on-insulator substrate with transistors on a silicon substrate.

It may be advantageous to set forth definitions of certain words and phrases used in this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of producing a single-crystal layer first material on a second material, the second material located between at least two surface portions of a single-crystal third material, the method comprising:

forming a single-crystal layer of the first material on each of the two surface portions of the third material through deposition of the first material on each of the two surface portions of the third material and recrystallization annealing of the deposited first material, wherein the second material is not the same material as the first material;

growing the single-crystal layer epitaxially until the second material is covered by the first material; and performing an annealing operation on the single-crystal layer.

2. The method according to claim 1, wherein the first material comprises germanium.

3. The method according to claim 1, wherein the third material comprises silicon.

4. The method according to claim 1, wherein the second material is a dielectric.

5. The method according to claim 1, wherein the second material comprises an oxide of the third material or a nitride of the third material.

6. The method according to claim 1, wherein forming the single-crystal layer of the first material further comprises:

performing a reduced-pressure chemical vapour deposition (RPCVD); and after performing the RPCVP, performing recrystallization annealing the single-crystal layer.

7. The method according to claim 1, wherein prior to the forming the single-crystal layer of the first material, the method further comprises:

forming a second layer comprising the second material on at least part of the surface of said single-crystal third material; and producing at least two apertures in the second layer, so as to form two surface portions of said single-crystal third material.

8. The method according to claim 1 further comprising: performing additional chemical-mechanical polishing on the surface of the first material.

9. The method according to claim 1 further comprising:

depositing a dielectric layer encapsulating the layer of the first material;

performing a second annealing operation at a temperature above the melting point of the first material; and removing the encapsulating dielectric layer.

10. A method of producing a single-crystal layer of first material on a second material located between at least two surface portions of a single-crystal third material, the method comprising:

growing the single-crystal layer epitaxially until the second material is covered by the first material through deposition of the first material on each of the two surface portions of the third material and recrystallization annealing of the deposited first material wherein the second material is not the same material as the first material;

performing an annealing operation on the single-crystal layer;

depositing a dielectric layer encapsulating the layer of the first material;

performing a second annealing operation at a temperature above the melting point of the first material; and removing the encapsulating dielectric layer.

11. The method according to claim 10, wherein the first material comprises germanium.

12. The method according to claim 10, wherein the third material comprises silicon.

13. The method according to claim 10, wherein the second material is a dielectric.

14. The method according to claim 10, wherein the second material comprises an oxide of the third material or a nitride of the third material.

15. The method according to claim 10, wherein forming the single-crystal layer of the first material further comprises:

performing a reduced-pressure chemical vapour deposition (RPCVD); and after performing the RPCVD, performing recrystallization annealing the single-crystal layer.

16. The method according to claim 10, wherein prior to the forming the single-crystal layer of the first material, the method further comprises:

forming a second layer comprising the second material on at least part of the surface of said single-crystal third material; and producing at least two apertures in the second layer, so as to form two surface portions of said single-crystal third material.

17. The method according to claim 10 further comprising:

performing additional chemical-mechanical polishing on the surface of the first material.

18. A method, comprising:

forming a single-crystal layer of a first material on each of at least two surface portions of a third material through deposition of the first material on the at least two surface portions of the third material and recrystallization annealing of the deposited first material, wherein a second material is located in between the at least two surface portions of the third material;

growing the single-crystal layer epitaxially until the second material is covered by the first material; and performing an annealing operation on the single-crystal layer.

19. The method according to claim 18, wherein the first material comprises germanium.

20. The method according to claim 18, wherein the third material comprises silicon.

\* \* \* \* \*

UNITED STATES PATENT AND TRADEMARK OFFICE
CERTIFICATE OF CORRECTION

| | | |
|---|---|---|
| PATENT NO. | : 7,749,817 B2 | Page 1 of 1 |
| APPLICATION NO. | : 11/653796 | |
| DATED | : July 6, 2010 | |
| INVENTOR(S) | : Olivier Kermarec et al. | |

It is certified that error appears in the above-identified patent and that said Letters Patent is hereby corrected as shown below:

Column 6, claim 6, line 36, delete "RPCVP" and replace with --RPCVD--.

Signed and Sealed this
Twenty-eighth Day of June, 2011

David J. Kappos
*Director of the United States Patent and Trademark Office*